US006530993B2

United States Patent
Hwang et al.

(10) Patent No.: US 6,530,993 B2
(45) Date of Patent: Mar. 11, 2003

(54) CLUSTER TOOL FOR FABRICATING SEMICONDUCTOR DEVICE

(75) Inventors: Chul Ju Hwang, Seongnam (KR); Sung Weon Lee, Yongin (KR)

(73) Assignee: Jusung Engineering Co., Ltd. (KR)

( * ) Notice: Subject to any disclaimer, the term of this patent is extended or adjusted under 35 U.S.C. 154(b) by 35 days.

(21) Appl. No.: 09/793,949

(22) Filed: Feb. 27, 2001

(65) Prior Publication Data

US 2001/0017192 A1 Aug. 30, 2001

(30) Foreign Application Priority Data

Feb. 28, 2000 (KR) .......................................... 2000-9813

(51) Int. Cl.$^7$ .............................................. C23C 16/00
(52) U.S. Cl. ................... 118/719; 414/935; 156/345.31
(58) Field of Search ........................ 118/719; 414/935, 414/937, 939; 156/345.22, 345.31

(56) References Cited

U.S. PATENT DOCUMENTS

| | | | | |
|---|---|---|---|---|
| 4,709,655 A | * | 12/1987 | Mastrigt ..................... | 118/719 |
| 5,512,320 A | * | 4/1996 | Turner et al. ............... | 427/255 |
| 5,560,780 A | * | 10/1996 | Wu et al. .................... | 118/728 |
| 5,609,689 A | * | 3/1997 | Kato et al. ................... | 118/719 |
| 5,882,413 A | * | 3/1999 | Beaulieu et al. | |
| 6,039,811 A | * | 3/2000 | Park et al. ................... | 118/719 |
| 6,066,210 A | * | 5/2000 | Yonemitsu et al. ......... | 118/719 |
| 6,298,684 B1 | * | 10/2001 | Mitsuyoshi .................. | 62/337 |
| 6,395,094 B1 | * | 5/2002 | Tanaka et al. .............. | 118/719 |

* cited by examiner

*Primary Examiner*—Gregory Mills
*Assistant Examiner*—Sylvia R. MacArthur
(74) *Attorney, Agent, or Firm*—Ostrolenk, Faber, Gerb & Soffen, LLP

(57) ABSTRACT

A cluster tool for fabricating a semiconductor device includes: a transfer chamber having a wafer handling robot; a plurality of process chambers installed adjacent to each wall face of the transfer chamber; a loadlock chamber installed adjacent to different wall faces of the transfer chamber, in which a cassette is positioned to bring in and take out a wafer; and a cooling chamber installed at one side of a different wall face of the transfer chamber with an open-and-shut unit therebetween, the cooling chamber being provided with a wafer multiple-mounting unit having a plurality of wafer mounting plates for simultaneously mounting wafers which finishes undergoing processes in the process chamber and cooling them. Since it includes a fresh structure of wafer multiple-mounting unit, even though the plurality of process chambers of the cluster tool simultaneously proceed the fabrication process of a semiconductor device, the process bottle neck phenomenon as in the conventional art would not occur even though the wafer is delayed to be cooled. Consequently, the process time is shortened and thus the production cost of the semiconductor device can be reduced.

17 Claims, 3 Drawing Sheets

CLUSTER TOOL FOR FABRICATING SEMICONDUCTOR DEVICE

BACKGROUND OF THE INVENTION

1. Field of the Invention

The present invention relates to a equipment for fabricating a semiconductor device, and more particularly to a cluster tool having a wafer cooling apparatus for fabricating a semiconductor device that is capable of solving a problem of bottleneck occurring in performing processes for fabricating a semiconductor device.

2. Description of the Background Art

A cluster tool for fabricating a semiconductor device refers to a multiple reaction chamber type composite equipment which includes a polyhedral transfer chamber with a wafer handling robot inserted at the center thereof, a plurality of process chambers positioned at each wall face of the polyhedral transfer chamber; and a loadlock chamber installed at a different wall face of the transfer chamber.

FIG. 1 is a schematic view illustrating a construction of the cluster tool 100 for fabricating a semiconductor device. At the center of the cluster tool, there is installed a wafer transfer chamber 130. The transfer chamber 130 is formed in a polyprism shape having a plurality of wall faces, and a wafer handling robot 132 is installed at the central portion of the transfer chamber 130 to transfer automatically the Wafer 140.

The wafer transfer robot 132 takes out the wafer 140 from the process chambers 110a, 110b and 110c and transfers it to loadlock chambers 120a and 120b or transfers the wafer from the loadlock chambers 120a and 120b to the process chambers 110a, 110b and 110c.

The plurality of process chambers 110a, 110b and 110c are attached at the plurality of wall faces of the transfer chamber 130, respectively.

A wafer aligner 122 and a first loadlock chamber 120a are attached in serial at a wall face of the transfer chamber 130. A cooling plate 124 and a second loadlock chamber 120b are installed at a wall face of the transfer chamber 130. The first and the second loadlock chambers 120a and 120b include a cassette (not shown) respectively with a plurality of wafers mounted thereon.

The operation of the cluster tool for fabricating a semiconductor device constructed as described above will now be explained.

First, a cassette (not shown) having the plurality of wafers is mounted at the first loadlock chamber 120a.

Next, the pressure in the first loadlock chamber 120a is lowered to a certain level by means of a vacuum pump.

When the pressure of the first loadlock chamber 120a is lowered to a desired level, the wafer handling robot 132 takes out the wafer from the cassette and puts it on the wafer aligner 122 for flat zone alignment of the wafer.

The aligned wafer is put into the process chamber 110a by the wafer handling robot 132 and undergoes fabrication processes of a semiconductor device.

In case that a unit process in fabricating a semiconductor device is performed in a state that the wafer is heated, after the process is completed, the wafer is taken out from the process chamber 110a by the wafer handling robot 132 and mounted on the cooling plate 124, that is, an incooler, so as to be cooled at a room temperature.

The cooled wafer is put in the cassette of the second loadlock chamber 120b by the wafer handling robot 132 and then fetched out from the cluster tool.

In case that the temperature in the process chamber 110a, 110b, 110c is more than 300° C., approximately, it takes 100 seconds to cool the wafer on the cooling plate 124 of the cooling chamber 130.

In this respect, however, the cooling plate 124 of the cluster tool for fabricating a semiconductor device of the conventional art allows only one wafer to be mounted. Thus, when the plurality of process chambers performs the processes simultaneously at a high temperature, a process bottle neck phenomenon occurs due to the delay in cooling of the wafer.

In other words, even though the fabrication process of a semiconductor device is terminated in each process chamber, since the wafer is mounted on the cooling plate only one by one, in case that other wafer is in the state of cooling, the process is in a standby state without proceeding further process successively, causing a problem that the overall term of the fabrication process of a semiconductor device is lengthened.

SUMMARY OF THE INVENTION

Therefore, an object of the present invention is to provide a cluster tool for fabricating a semiconductor device that is capable of removing the process bottle neck phenomenon caused due to delay in cooling a wafer of a cluster tool having a plurality of process chamber.

To achieve these and other advantages and in accordance with the purpose of the present invention, as embodied and broadly described herein, there is provided a cluster tool for fabricating a semiconductor device comprising: a transfer chamber having a wafer handling robot in center portion and a plurality of wall faces; a plurality of process chambers installed adjacent to each wall face of the transfer chamber; a loadlock chamber installed adjacent to a wall face of the transfer chamber, in which a cassette is positioned to bring in and take out a wafer; and a cooling chamber installed at a wall face of the transfer chamber with an open-and-shut unit therebetween, the cooling chamber being provided with a wafer multiple-mounting unit having a plurality of wafer mounting plates for simultaneously mounting wafers which finishes undergoing processes in the process chamber and cooling them.

In the cluster tool for fabricating a semiconductor device of the present invention, a wafer contact portion of the wafer mounting plate is made of ceramic or quartz.

In the cluster tool for fabricating a semiconductor device of the present invention, the wafer mounting plate includes a stainless steel plate and a ceramic layer or a quartz layer coated at the upper portion of the stainless steel plate.

In the cluster tool for fabricating a semiconductor device of the present invention, the number of the wafer mounting plates are five or 25.

In the cluster tool for fabricating a semiconductor device of the present invention, a cooling gas injection pipe is connected with the cooling chamber to inject a cooling gas of nitrogen or argon in the cooling chamber.

In the cluster tool for fabricating a semiconductor device of the present invention, a water cooled tube is installed to surround the wall of the cooling chamber to cool the inner side of the cooling chamber.

In order to achieve the above objects, the cluster tool for fabricating a semiconductor device further includes: an open-and-shut unit provided at both walls of the loadlock chamber and of the cooling chamber so as for the cooling chamber and the loadlock chamber to selectively communicate with each other; a cassette transfering device for moving the cassette and a wafer multiple-mounting unit transferring device for moving the wafer multiple-mounting unit.

In the cluster tool for fabricating a semiconductor device of the present invention, the cassette transfering device reciprocally rotates the cassette between the transfer chamber direction and the wafer multiple-mounting unit direction, and the wafer multiple-mounting unit moving device includes: a first unit for reciprocally rotating the wafer multiple-mounting unit between the transfer module direction and the cassette direction; a second unit for adjusting a height of the wafer mounting plate to a slot position of the cassette; and a third unit for forwarding the wafer multiple-mounting unit to the cassette and retreating it.

In the cluster tool for fabricating a semiconductor device of the present invention, the second unit is a vertical transfer unit of the wafer multiple-mounting unit itself or a vertical shift unit of the wafer mounting plate itself.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
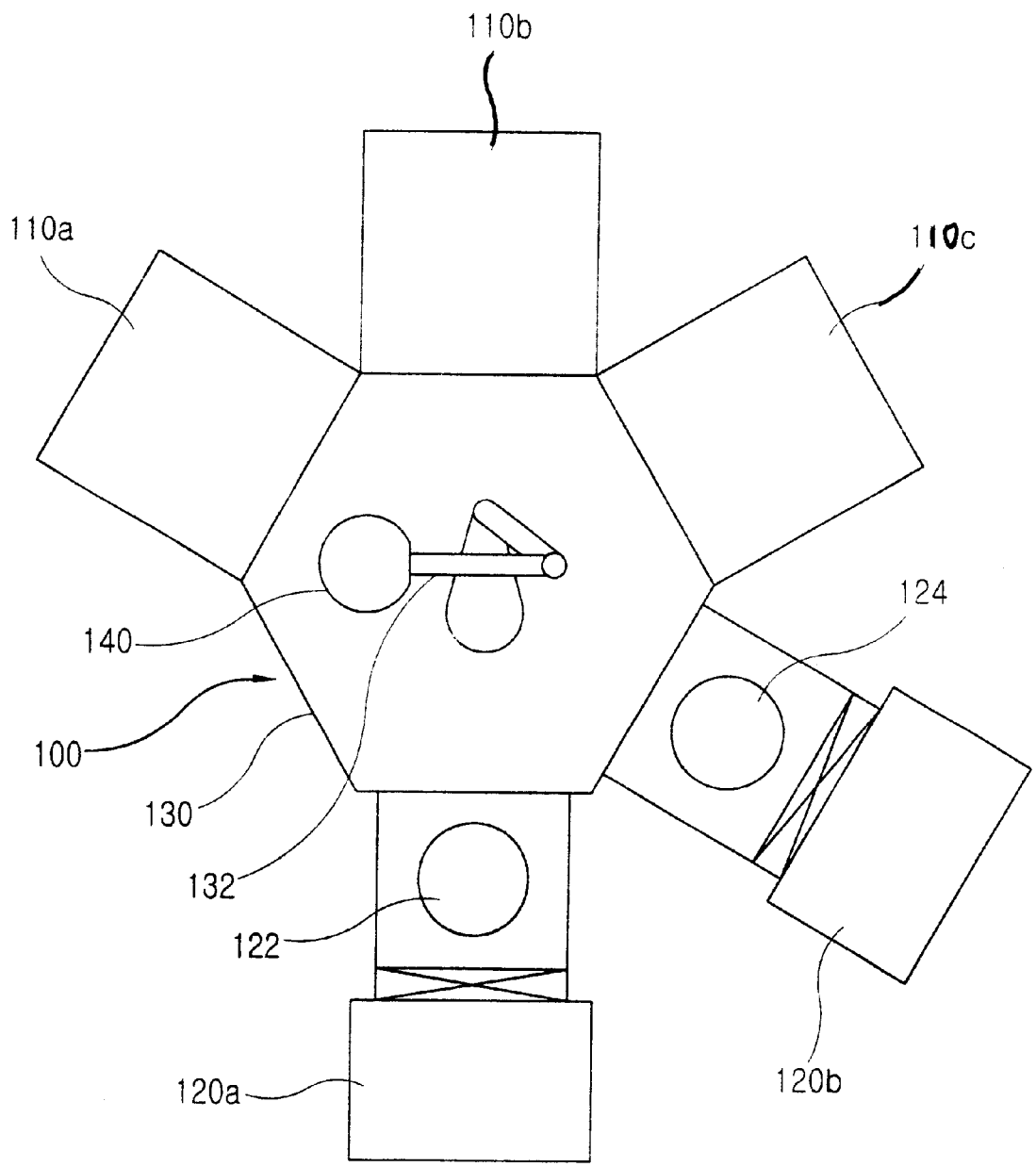
FIG. 1 is a schematic diagram illustrating a cluster tool for fabricating a semiconductor device in accordance with a conventional art.
Figure 2:
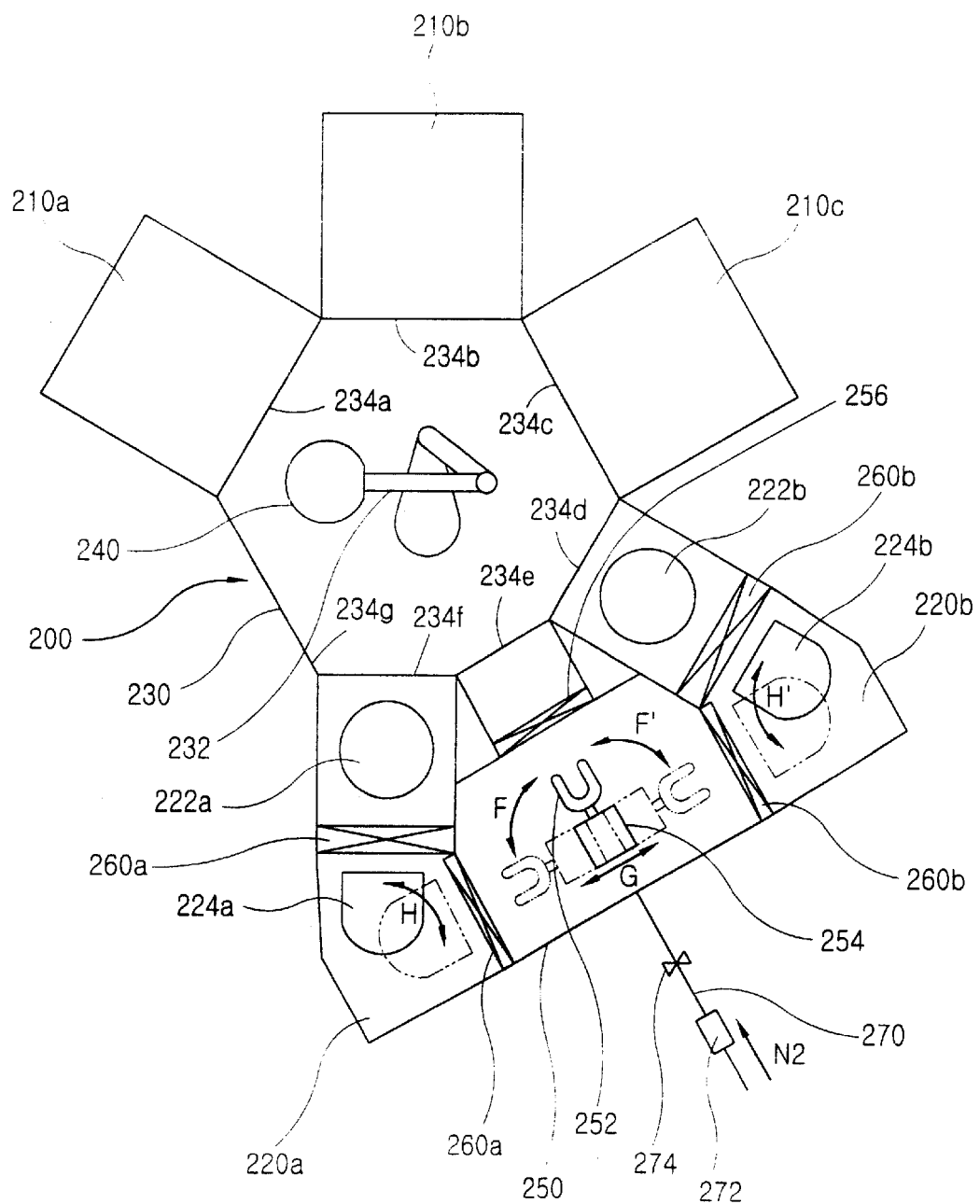
FIG. 2 is a schematic diagram illustrating a cluster tool for fabricating a semiconductor device in accordance with the present invention.

FIG. 2 is a schematic diagram illustrating a cluster tool for fabricating a semiconductor device in accordance with the present invention.

As shown in the drawing, a basic platform is a polyhedral transfer chamber 230 provided with a wafer handling robot 232 formed at the center thereof for automatically transferring a wafer 240. The transfer chamber 230 in accordance with a preferred embodiment of the present invention has seven chamber wall faces 234a through 234g.

Process chambers 210a, 210b and 210c are adjacently installed at the first to third side wall faces 234a, 234b and 234c of the transfer chamber 230, respectively.

A first and a second wafer aligners 222a and 222b are installed attached to the fourth wall face 234d and the sixth wall face 234f of the transfer chamber 230.

A first and a second loadlock chambers 224a and 224b are installed adjacent to the first and the second wafer aligners 222a and 222b.

An open-and-shut unit 226 is installed between the first and the second wafer aligners 222a and 222b and the first and the second loadlock chambers 224a and 224b.

The construction of the cluster tool of the present invention as so far described is similar to that of the conventional art.

However, as shown in FIG. 2, the cluster tool according to the preferred embodiment of the present invention additionally includes a cooling chamber 250. The cooling chamber 250 is also positioned between the first loadlock chamber 220a and the second loadlock chamber 220b as well as being positioned adjacent to the fifth wall face 234e of the transfer chamber 230.

An open-and-shut unit 256 is installed between the transfer chamber 230 and the cooling chamber 250, and open-and-shut units 260a and 260b are respectively installed between the first and the second loadlock chambers 220a, 220b and the cooling chamber 250. Accordingly, through the open-and-shut units 250, 260a and 260b, the wafer can be freely transferred by the handling robot 232 between the transfer units and between the loadlock chambers 220a and 220b and the cooling chamber 250.

The cooling chamber 250 includes a wafer multiple-mounting unit 254 having a prop 259 to which a plurality of wafer mounting plates 252 are perpendicularly attached at uniform intervals. The wafer mounting plates 252 are connected to the prop 259 using connection bars 253. The intervals between the plurality of wafer mounting plates 252 is the same as the slot intervals of the cassettes 224a and 224b installed within the first and the second loadlock chambers 220a and 220b.

A wafer multiple-mounting unit transferring device (now shown) is installed in the wafer multiple-mounting unit 254 to move the wafer mounting plate 252 vertically and horizontally (G) or rotate (F, F') the wafer mounting plate 252. The transferring device is comprised of a first unit (not shown), a second unit(now shown) and a third unit(not shown). The first unit rotates(F, F') the wafer mounting plate 252 between the cooling chamber direction and the cassettes direction. The second unit moves the wafer mounting plate 252 in vertical direction to align the height of the wafer mounting plate 252 with the height of the slots of the cassette 224a, 224b placed in the loadlock chambers 220a, 220b. In this respect, the vertical direction refers to a direction perpendicular to the horizontal direction of the cluster tool, signifying the direction vertical to the sheet of FIG. 2. The third unit moves the wafer mounting plate 252 in horizontal direction from the cooling chamber 250 to loadlock chambers 220a, 220b.

A cassette position transferring device (not shown) is provided at the lower portion of the cassettes 224a and 224b respectively installed in the first and the second loadlock chambers 220a and 220b, to reciprocally rotate (H, H') the cassettes 224a and 224b between the transfer chamber 230 direction and the wafer multiple-mounting unit 254 direction.

Open-and-shut units 260a and 260b are respectively installed between the first and the second loadlock chambers 220a and 220b and the cooling chamber 250 to selectively communicate them.

A cooled gas injection tube 270 is connected to the cooling chamber 250 to supply a cooling $N_2$ gas. The cooling N2 gas is supplied into the cooling chamber 250 by passing through a gas filter 272 and a flow control valve 274. In addition, in order to cool inside the cooling chamber, a water cooled tube (not shown) surrounds the wall of the cooling chamber.

Figure 3:
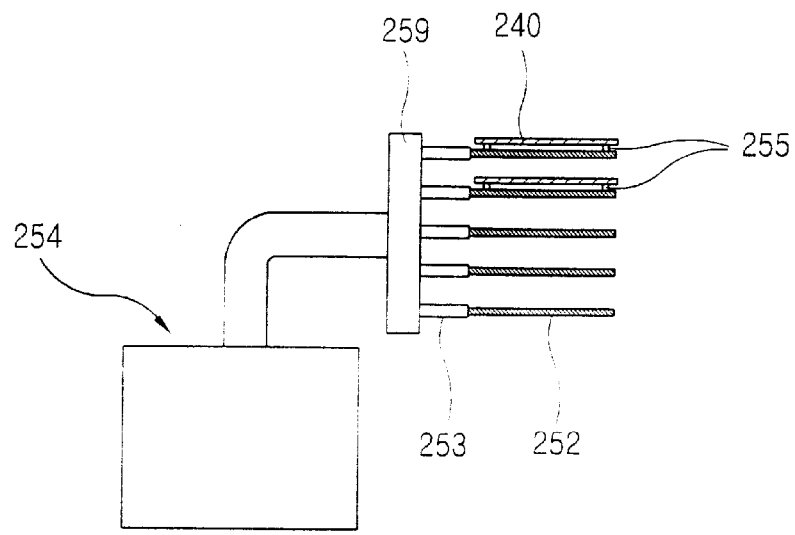
FIG. 3 is a side view of a wafer multiple-mounting unit in accordance with the present invention.

FIG. 3 is a side view of a wafer multiple-mounting unit in accordance with the present invention.

With reference to FIG. 3, a plurality of wafer mounting plates 252 are attached at the typical slot intervals of the cassette to a prop 259 using connection bars 253. It is shown that wafers 240 to be cooled are mounted on two wafer mounting plates 252 among five ones. The wafers 240 are mounted by contacting quartz balls or ceramic balls 255 protrusively formed on the wafer mounting plate 252, rather than directly contacting the wafer mounting plate 252.

Figure 4:
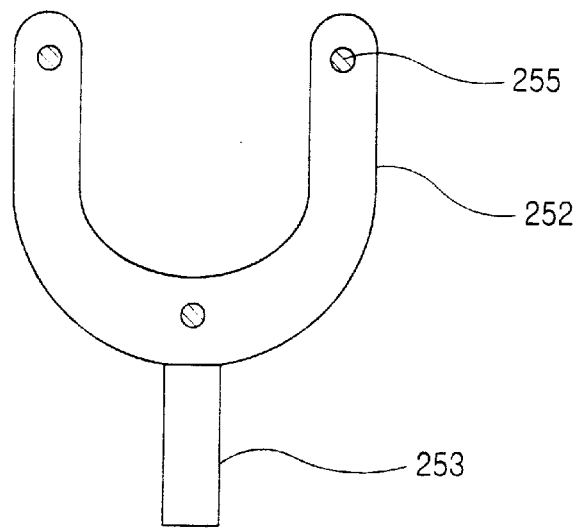
FIG. 4 is a plan view of a wafer mounting plate in accordance with the present invention.

FIG. 4 is a plan view of a wafer mounting plate in accordance with the present invention.

As shown in the drawing, the wafer mounting plate 252 attached to the connection bar 253 is U-shaped on which the quartz balls or ceramic balls 255 are protrusively formed.

If the wafer mounting plate 252 is made of a stainless steel, the quartz ball 255 serves to protect the wafer from damaging by preventing the from directly contacting the wafer mounting plate 252. If the wafer mounting plate 252 itself is made of ceramic or quartz, such as quartz ball is not necessary. Meanwhile if the wafer mounting plate 252 is made of stainless steel and quartz layer or ceramic layer is coated on the upper surface thereof, the quartz ball or the ceramic ball is not necessary.

The operation of the cluster tool for fabricating a semiconductor device constructed as described above will now be explained.

As the wafer 240 completes undergoing the processes performed in one of the process chambers 210a, 210b and 210c, it is taken out from the process chamber by the wafer handling robot 232. And then, when the cooling chamber open-and-shut unit 256 is opened, it is mounted on the wafer mounting plate 252. In this process, the robot 232 forwards to the wafer multiple-mounting unit 254 so that the wafer mounting plate 252 receives the wafer 240. At this time, in order to adjust the height between the robot 232 and the wafer mounting plate 252, either one of the robot 232 and the wafer mounting plate 252 is vertically fine-adjusted.

Five sheets of process-completed wafers can be cooled on the five wafer mounting plates 252. After the cooling-subject wafers are filled in the wafer mounting plates 252 and cooled until the wafer mounting plate 252 is completely filled, the wafer multiple-mounting unit 254 rotates in the 'F' direction or in the 'F' direction toward the first cassette 224a in the first loadlock chamber 220a or toward the second cassette 224b in the second loadlock chamber 220b. In response, the first cassette 224a of the first loadlock chamber 220a or the second cassette 224b of the second loadlock chamber 220b also rotate in the 'H' direction or in the 'H' direction toward the wafer multiple-mounting unit 254.

When the direction of the cassette and the wafer multiple-mounting unit are adjusted, one of the open-and-shut units 260a and 260b is opened, and the wafer multiple-mounting unit 254 is transferred in the 'G' direction to put the five sheets of wafers into the cassette.

Generally, one lot of wafers, that is, 25 sheets of wafers, can be received by the first and the second cassettes 224a and 224b. Thus, when the above process is repeatedly performed five times, the completely cooled wafers can be all received into the cassette. If the wafer mounting plate is constructed by 25 ones in number, the completely cooled wafers can be all received into the cassette. It is preferred to determine the number of the wafer mounting plates by the number of divisor of 25. The reason for this is that after the wafers are put in the wafer mounting plates and cooled, the cassette can be completely filled with the wafers without an empty slot.

As so far described, the cluster tool for fabricating a semiconductor device of the present invention has an advantage that since it includes a fresh structure of wafer multiple-mounting unit, even though the plurality of process chambers of the cluster tool simultaneously proceed the fabrication process of a semiconductor device, the process bottle neck phenomenon as in the conventional art would not occur even though the wafer is delayed to be cooled. Consequently, the process time is shortened.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A cluster tool for fabricating a semiconductor device comprising:

a transfer chamber having a wafer handling robot at the center and a plurality of wall faces;

a plurality of process chambers installed adjacent to each wall face of the transfer chamber;

at least two loadlock chambers installed adjacent to a wall face of the transfer chamber, in which a cassette for holding wafers is positioned to bring in and take out a wafer;

a cooling chamber installed between the loadlock chambers and adjacent to a wall face of the transfer chamber with an open-and-shut unit therebetween, the cooling chamber being provided with a wafer multiple-mounting unit having a plurality of wafer mounting plates for simultaneously mounting wafers which finish undergoing processes in the process chamber and cooling them; and a transferring device for moving the wafer multiple-mounting unit included in the cooling chamber.

2. The cluster tool of claim 1, wherein a wafer aligner is installed between the loadlock chambers and the transfer chamber.

3. The cluster tool of claim 1, wherein the plurality of wafer mounting plates are installed maintaining uniform intervals vertically in the wafer multiple-mounting unit.

4. The cluster tool of claim 1, wherein a wafer contact portion of the wafer mounting plate is made of ceramic or quartz.

5. The cluster tool of claim 1, wherein the wafer mounting plate comprises:

a stainless steel plate; and a ceramic layer or a quartz layer coated on the upper portion of the stainless steel plate.

6. The cluster tool of claim 1, wherein the wafer mounting plate comprises:

a stainless steel plate; and a quartz ball or a ceramic ball attached on a portion of the upper surface of the stainless steel plate.

7. The cluster tool of claim 1, wherein the number of the wafer mounting plates is five(5) or twentyfive(25).

8. The cluster tool of claim 1, wherein a cooling gas injection pipe is connected with the cooling chamber to inject a cooling gas of nitrogen or argon in the cooling chamber.

9. The cluster tool of claim 1, wherein a water cooled tube is installed to surround the wall of the cooling chamber to cool the inner side of the cooling chamber.

10. The cluster tool of claim 1, wherein the cooling chamber is positioned adjacent to the loadlock chambers, an open-and-shut unit is provided at both walls of the loadlock chambers and of the cooling chamber to enable the cooling chamber and the loadlock chamber to selectively communicate with each other.

11. The cluster tool of claim 10, wherein each of the loadlock chambers includes a cassette position transferring device.

12. The cluster tool of claim 11, wherein the cassette position transferring device reciprocally rotates the cassette between a transfer chamber direction and a wafer multiple-mounting unit direction.

13. The cluster tool of claim 11, wherein the wafer multiple-mounting unit transferring device includes a first unit which has a function of reciprocally rotating the wafer multiple-mounting unit between the transfer chamber direction and the cassette direction, a second unit which has a function of adjusting the height of the wafer mounting plate to be aligned with a slot position of the cassette, and a third unit which has a function of forwarding the wafer multiple-mounting unit to the cassette and retreating it.

14. The cluster tool of claim 13, wherein the adjusting function is to transfer the wafer multiple-mounting unit vertically.

15. The cluster tool of claim 13, wherein the adjusting function is to transfer the wafer mounting plate vertically.

16. The cluster tool of claim 1, wherein the transferring device is constructed to move the wafer-multiple mounting unit linearly.

17. The cluster tool of claim 1, wherein the transferring device is constructed to move the wafer-multiple mounting unit rotationally.

* * * * *